US008345225B2

(12) United States Patent
Onvlee et al.

(10) Patent No.: US 8,345,225 B2
(45) Date of Patent: Jan. 1, 2013

(54) CONTROLLABLE RADIATION LITHOGRAPHIC APPARATUS AND METHOD

(75) Inventors: Johannes Onvlee, s-Hertogenbosch (NL); Marcel Mathijs Theodore Marie Dierichs, Venlo (NL)

(73) Assignee: ASML Netherlands B.V., Veldhoven (NL)

( * ) Notice: Subject to any disclaimer, the term of this patent is extended or adjusted under 35 U.S.C. 154(b) by 577 days.

(21) Appl. No.: 12/539,973

(22) Filed: Aug. 12, 2009

(65) Prior Publication Data

US 2010/0045954 A1 Feb. 25, 2010

Related U.S. Application Data

(60) Provisional application No. 61/088,909, filed on Aug. 14, 2008.

(51) Int. Cl.
| | |
|---|---|
| G03B 27/74 | (2006.01) |
| G03B 27/54 | (2006.01) |
| G03B 27/44 | (2006.01) |
| G03B 27/42 | (2006.01) |
| G03B 27/52 | (2006.01) |
| G03B 27/32 | (2006.01) |

(52) U.S. Cl. ............... 355/70; 355/37; 355/46; 355/53; 355/55; 355/77

(58) Field of Classification Search ............... 355/37, 355/46, 52, 53, 55, 67–71, 77; 356/326, 356/319–320; 362/209, 227, 230, 249.02, 362/332, 334–338, 611–613, 216, 235–237, 362/253, 255, 257, 311.01–311.02, 311.14, 362/326, 329
See application file for complete search history.

(56) References Cited

U.S. PATENT DOCUMENTS

| | | | | |
|---|---|---|---|---|
| 4,728,982 A | * | 3/1988 | Takemura | 399/186 |
| 4,746,958 A | * | 5/1988 | Yamakawa | 355/68 |
| 5,731,874 A | * | 3/1998 | Maluf | 356/326 |
| 5,838,709 A | * | 11/1998 | Owa | 372/68 |
| 6,229,639 B1 | * | 5/2001 | Ozarski et al. | 359/223.1 |
| 6,233,039 B1 | * | 5/2001 | Yen et al. | 355/53 |
| 6,515,734 B1 | * | 2/2003 | Yamada et al. | 355/54 |
| 6,707,548 B2 | * | 3/2004 | Kreimer et al. | 356/301 |

(Continued)

FOREIGN PATENT DOCUMENTS

JP 2004-335826 A 11/2004
(Continued)

OTHER PUBLICATIONS

English transition of JP 2004-335952, published Nov. 25, 2004.*

(Continued)

*Primary Examiner* — Toan Ton
*Assistant Examiner* — Christina Riddle
(74) *Attorney, Agent, or Firm* — Sterne, Kessler, Goldstein & Fox P.L.L.C

(57) ABSTRACT

A lithographic arrangement allows for controlling radiation characteristics. An illumination system provides a beam of radiation from radiation provided by a radiation source. The radiation source includes an array of individually controllable elements, each individually controllable element being capable of emitting radiation. A support structure supports a patterning device. The patterning device imparts the radiation beam with a pattern. A projection system projects the patterned radiation beam onto a target portion of a substrate held by a substrate table. A radiation peak intensity detection apparatus detects a peak in the intensity of an emission spectrum of one or more of the individually controllable elements of the radiation source.

33 Claims, 11 Drawing Sheets

U.S. PATENT DOCUMENTS

Figure 1A:
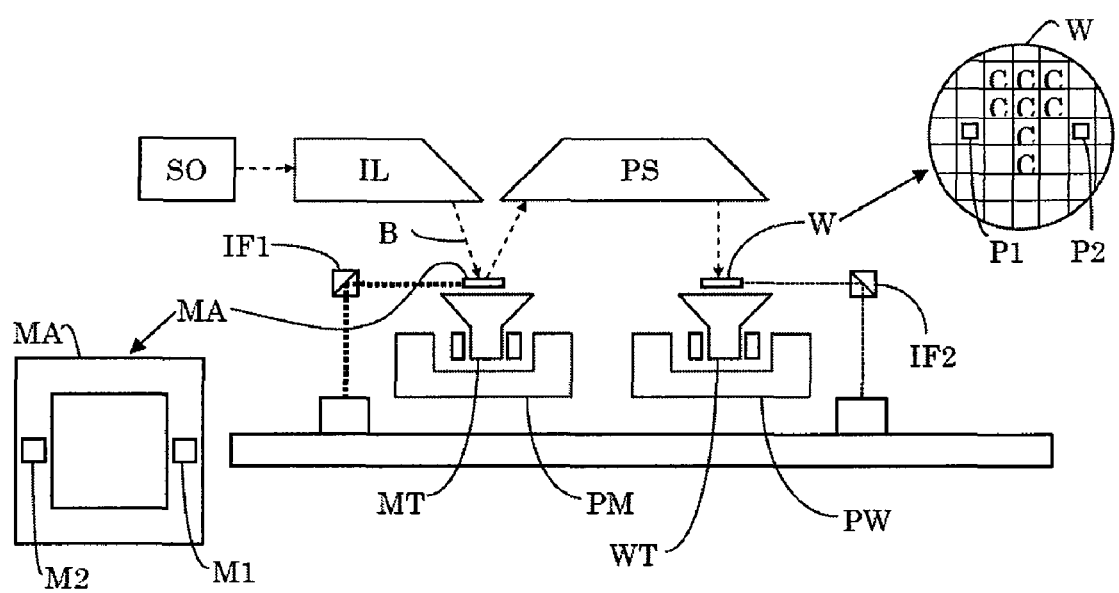

| | | | |
|---|---|---|---|
| 6,803,991 B2 * | 10/2004 | Mori | 355/53 |
| 7,645,054 B2 * | 1/2010 | Goihl | 362/244 |
| 7,868,999 B2 | 1/2011 | Heintze et al. | |
| 7,878,663 B2 | 2/2011 | Inoue et al. | |
| 2003/0137838 A1 * | 7/2003 | Rizkin et al. | 362/240 |
| 2003/0202349 A1 * | 10/2003 | Suehiro et al. | 362/245 |
| 2005/0195380 A1 * | 9/2005 | Sytsma et al. | 355/69 |
| 2006/0082999 A1 * | 4/2006 | Klein | 362/311 |
| 2008/0111983 A1 * | 5/2008 | Singer et al. | 355/69 |
| 2009/0072167 A1 * | 3/2009 | Kanazawa | 250/504 R |

FOREIGN PATENT DOCUMENTS

| | | | |
|---|---|---|---|
| JP | 2004-335952 A | 11/2004 | |
| JP | 2008-047897 A | 2/2008 | |
| JP | 2008-090017 A | 4/2008 | |
| JP | 2008-090018 A | 4/2008 | |

OTHER PUBLICATIONS

English-Language Abstract for JP 2004-335826 A, published Nov. 25, 2004; 1 page.

English-Language Abstract for JP 2004-335952 A, published Nov. 25, 2004; 1 page.

English-Language Abstract for JP 2008-047897 A, published Feb. 28, 2008; 1 page.

English-Language Abstract for JP 2008-090017 A, published Apr. 17, 2008; 1 page.

English-Language Abstract for JP 2008-090018 A, published Apr. 17, 2008; 1 page.

English-Language Translation of Notice of Reasons for Rejection directed to related Japanese Patent Application No. 2009-183971, mailed Jun. 9, 2011, from the Japanese Patent Office; 6 pages.

* cited by examiner

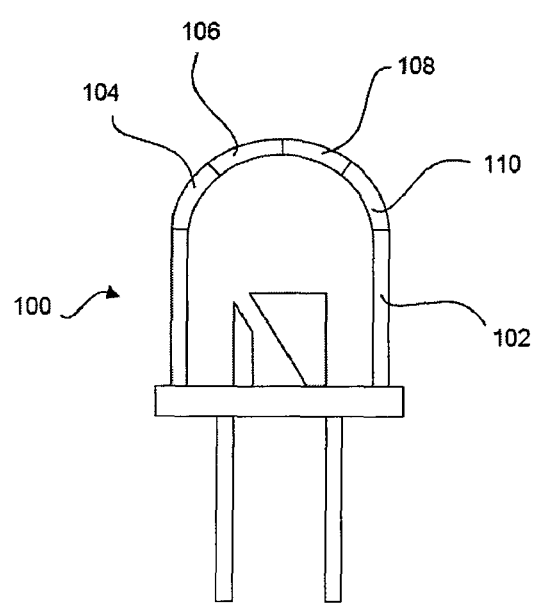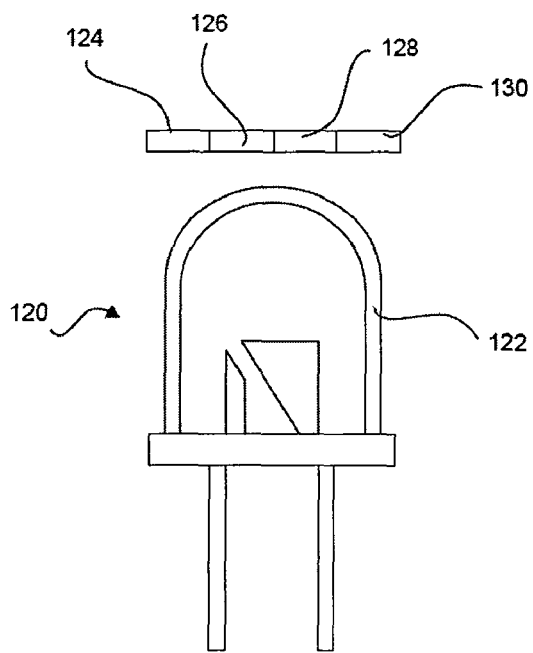
FIG. 11a                    FIG. 11b

CONTROLLABLE RADIATION LITHOGRAPHIC APPARATUS AND METHOD

CROSS REFERENCE TO RELATED APPLICATIONS

This application claims the benefit under 35 U.S.C. §119(e) to Provisional Patent Application No. 61/088,909 filed Aug. 14, 2008, which is incorporated by reference herein in its entirety.

BACKGROUND

1. Field of the Invention

The present invention relates to a lithographic apparatus and device manufacturing method.

2. Related Art

A lithographic apparatus is a machine that applies a desired pattern onto a target portion of a substrate. Lithographic apparatus can be used, for example, in the manufacture of integrated circuits (ICs). In that circumstance, a patterning device, which is alternatively referred to as a mask or a reticle, may be used to generate a circuit pattern corresponding to an individual layer of the IC, and this pattern can be imaged onto a target portion (e.g., including part of, one or several dies) on a substrate (e.g., a silicon wafer) that has a layer of radiation-sensitive material (resist). In general, a single substrate will contain a network of adjacent target portions that are successively exposed. Known lithographic apparatus include so-called steppers, in which each target portion is irradiated by exposing an entire pattern onto the target portion in one go, and so-called scanners, in which each target portion is irradiated by scanning the pattern through the beam in a given direction (the "scanning"-direction) while synchronously scanning the substrate parallel or anti-parallel to this direction.

The use of an array of LEDs as a source of radiation in a lithographic apparatus has been proposed. In particular, the use of an array of LEDs has been proposed as a radiation source for providing 365 nm (I-line) radiation. However, the peak intensity of an emission spectrum of an LED is known to drift, or in other words fluctuate. Such drift or fluctuation can occur for one of a number of reasons. For example, such drift or fluctuation can occur due to a temperature change of the LED, a change in the current with which the LED is driven, and/or general degradation over time of the LED. Furthermore, in an array of LEDs the wavelength or frequency at which the peak intensity of the emission spectrum occurs may vary between LEDs in the array. As a result, the bandwidth of a radiation source including an array of LEDs will be larger then the bandwidth of an individual LED. If the emission spectra of LEDs within the array are not consistent, there may be associated negative effects on the imaging quality of patterns applied to a substrate. Such negative effects could arise since the lithographic apparatus may be configured to receive, transmit, reflect, etc radiation having a specific wavelength. Therefore, a change in the wavelength at which the peak emission occurs from the array of LEDs can lead to degradation in the reception, transmission, reflection, etc. of the radiation in the lithographic apparatus. A change in the wavelength at which the peak emission occurs from the array of LEDs may also affect the application of patterns to a later of radiation sensitive material, since such material may only be sensitive (e.g., photoreactive) to radiation of a specific wavelength or narrow range of wavelengths.

It is desirable to provide, for example, a lithographic apparatus and method that obviates or mitigates one or more of the problems of the prior art referred to above.

SUMMARY

This section is for the purpose of summarizing some aspects of the present invention and to briefly introduce some preferred embodiments. Simplifications or omissions may be made to avoid obscuring the purpose of the section. Such simplifications or omissions are not intended to limit the scope of the present invention.

A first embodiment of the present invention provides a lithographic apparatus including at least the following elements. An illumination system provides a beam of radiation from radiation received from a radiation source. The radiation source includes an array of individually controllable elements, each individually controllable element being capable of emitting radiation. A support structure supports a patterning device. The patterning device imparts the radiation beam with a pattern in its cross-section. A projection system for projecting the patterned radiation beam onto a target portion of a substrate held in place by a substrate table. A radiation peak intensity detection apparatus is configured to detect a peak in the intensity of an emission spectrum of one or more individually controllable elements of the radiation source.

In one example, the lithographic apparatus may be provided with the radiation source. The illumination system may be provided with the radiation source. The radiation source may be located in a pupil plane of the illuminator, or adjacent to a pupil plane of the illuminator.

In one example, the individually controllable elements of the radiation source may be configured to emit radiation that has a peak emission wavelength in the UV, EUV, or beyond EUV range of the electromagnetic spectrum.

In one example, the peak in the emission spectrum may be associated with an emission wavelength or frequency at which the intensity of the emission spectrum is the highest.

In one example, the radiation peak intensity detection apparatus may be located in a position where radiation emitted by any one element of the array is incident upon the radiation peak intensity detection apparatus. The radiation peak intensity detection apparatus may be moveable into and out of the position.

In one example, the radiation peak intensity detection apparatus may be moveable between positions which are adjacent to the elements of the array. The radiation peak intensity detection apparatus may be moveable between positions which are adjacent to the elements of the array, such that the radiation peak intensity detection apparatus can be moved to a position where the emission spectrum of a specific individually controllable element can be detected. Alternatively, radiation emitted by individual elements of the array may be collected by a moveable fiber and directed to a sensor at a fixed location.

In one example, the radiation peak intensity detection apparatus may include the following elements. One or more radiation intensity detectors, each radiation detector being associated with a filter that is located in a position whereby radiation emitted by an individually controllable element of the radiation source passes through the filter before being detected by the radiation intensity detector.

In one example, the radiation peak intensity detection apparatus may include an odd number of radiation intensity detectors, each radiation detector being associated with a filter that is located in a position whereby radiation emitted by an individually controllable element of the radiation source passes through the filter before being detected by the radiation intensity detector. Each filter may have a different central pass-frequency or pass-wavelength. One filter may have a central pass-frequency or pass-wavelength which corresponds to a desired frequency or wavelength.

In one example, the apparatus may further include a control module for controlling the individually controllable elements of the radiation source.

In various embodiments, the control module may form part of the radiation source or form a part of the radiation peak intensity detection apparatus, or may be an independent piece of apparatus. The control module may be arranged to control a property that is used to control each of the individually controllable elements. The control module may be arranged to vary a property that is used to control the individually controllable elements. The control module may be arranged to control a property that is used to control the individually controllable elements, the property being a specific property which ensures that an individually controllable element being controlled has a desired peak in its emission spectrum. The control module may be arranged to determine the specific property, or is provided with information related to the specific property. The property may be a current provided to each individually controllable element.

In one example, one or more of the individually controllable elements may be associated with a plurality of optical elements for changing an emission profile of the one or more individually controllable elements. The one or more individually controllable elements may be provided with the plurality of optical elements. The plurality of optical elements may be located adjacent to the one or more individually controllable elements. The plurality of optical elements may be diffractive, reflective or refractive.

In one example, the individually controllable elements may be LEDs or laser diodes.

A second embodiment of the invention provides a method of detecting properties of a radiation source that is used in connection with a lithographic apparatus, or provided in the lithographic apparatus, the radiation source including an array of individually controllable elements, each individually controllable element being capable of emitting radiation, the method including the following steps:

varying a property that is used to control an individually controllable element;

detecting the intensity of radiation emitted by the individually controllable element as the property is varied in order to identify changes in the intensity of an emission spectrum of the individually controllable element as the property is varied; and determining a specific property (or in other words, value or magnitude of this property) for which the peak in the intensity of an emission spectrum of the element is a desired peak.

In one example, the method may further include controlling the individually controllable element using the specific property. The individually controllable element may be controlled using the specific property during the exposure of a target portion of a substrate.

In one example, the method may further include repeating the method for a plurality of individually controllable elements of the array, or for all individually controllable elements of the array.

In one example, before detecting radiation emitted by the individually controllable element as the property is varied, the method may further include moving a detector into a position where radiation emitted by the individually controllable element can be detected so that the detection may be undertaken.

Alternatively, radiation emitted by individual elements of the array may be collected by a moveable fiber and directed to a sensor at a fixed location.

In one example, the desired peak may be when the intensity of the emission spectrum is highest at a desired wavelength or frequency. Most preferably, the intensity of the emission spectrum of all elements of the array will be highest at the same desired wavelength or frequency.

According to a third embodiment of the invention, there is provided a lithographic arrangement including the following elements. A radiation source. The radiation source including an array of individually controllable elements, each element being capable of emitting radiation. An illumination system for providing a beam of radiation from radiation received from the radiation source. A support structure for supporting a patterning device. The patterning device serving to impart the radiation beam with a pattern in its cross-section. A substrate table for holding a substrate. A projection system for projecting the patterned radiation beam onto a target portion of the substrate. A control module for the radiation source. The control module being arranged to selectively prevent all radiation emitted by the individually controllable elements of the radiation source from passing through the lithographic apparatus by preventing all of the individually controllable elements of the radiation source from emitting radiation.

According to a fourth embodiment of the invention, there is provided a method of including the following steps. Providing a substrate. Using an array of individually controllable elements, each element being capable of emitting radiation, to provide a source of radiation. Using an illumination system to provide a beam of radiation from radiation received from the source of radiation. Using a patterning device to impart the radiation beam with a pattern in its cross-section. Projecting the patterned radiation beam onto a target portion of the substrate. Selectively preventing all radiation emitted by the individually controllable elements of the radiation source from passing through the lithographic apparatus by preventing all of the individually controllable elements of the radiation source from emitting radiation.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

The accompanying drawings, which are incorporated herein and form a part of the specification, illustrate one or more embodiments of the present invention and, together with the description, further serve to explain the principles of the invention and to enable a person skilled in the pertinent art to make and use the invention.

Figure 1B:
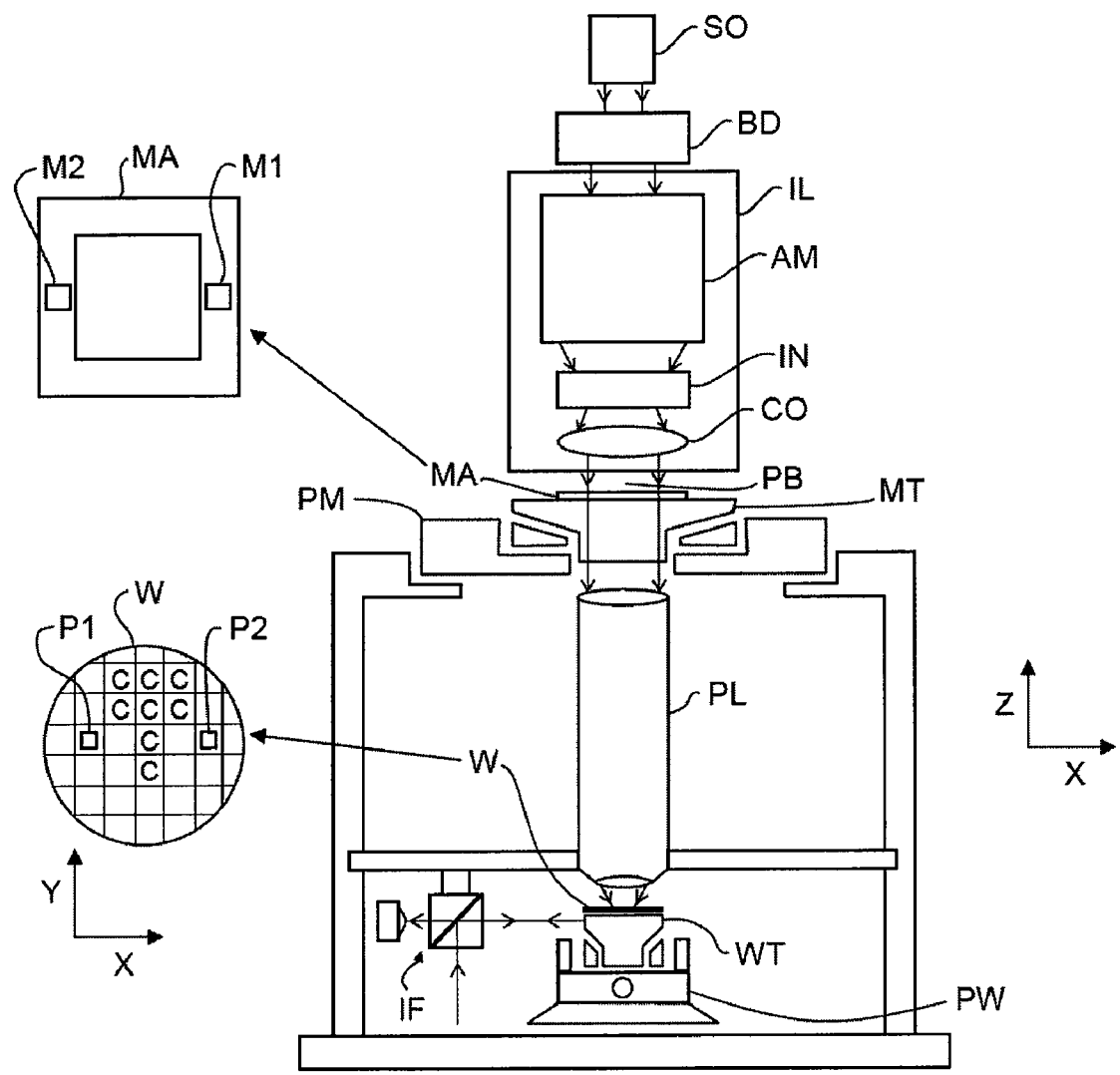

FIGS. 1A and 1B schematically depict lithographic apparatus, according to embodiments of the invention.

Figure 2A:
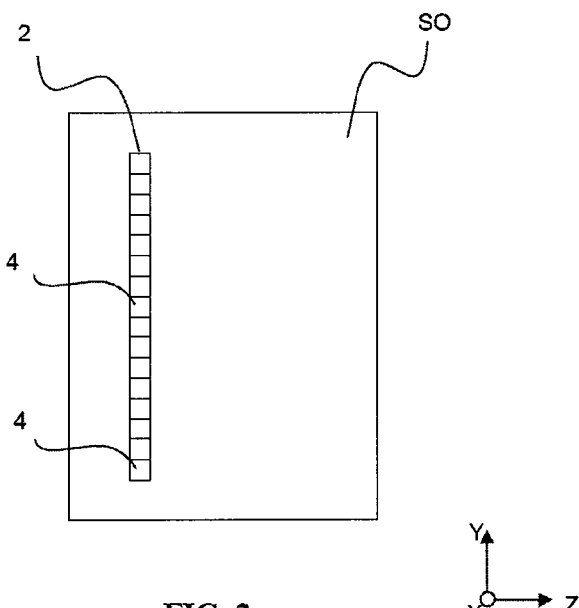
Figure 2B:
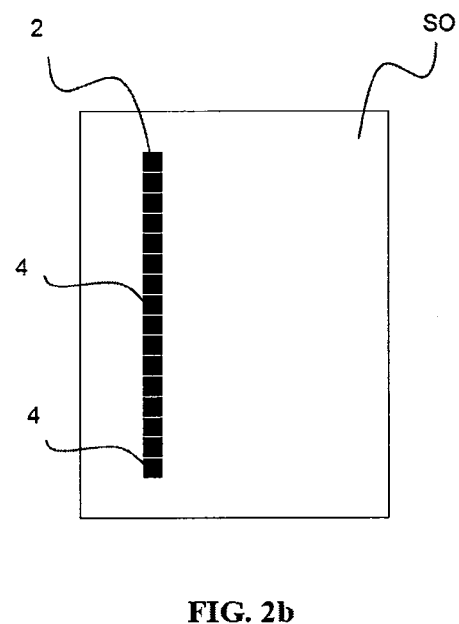

FIGS. 2a and 2b schematically depict a radiation source including an array of LEDs.

Figure 3A:
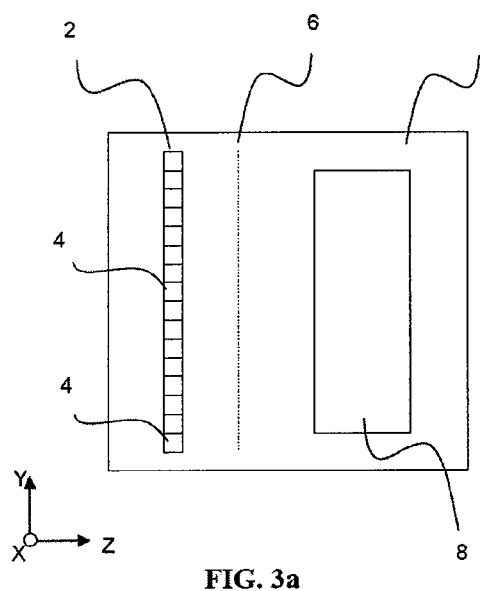
Figure 3B:
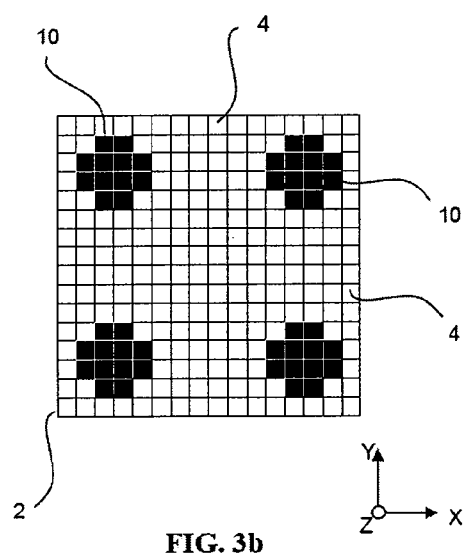

FIGS. 3a and 3b schematically depict an illuminator of a lithographic apparatus including an array of LEDs.

Figure 4A:
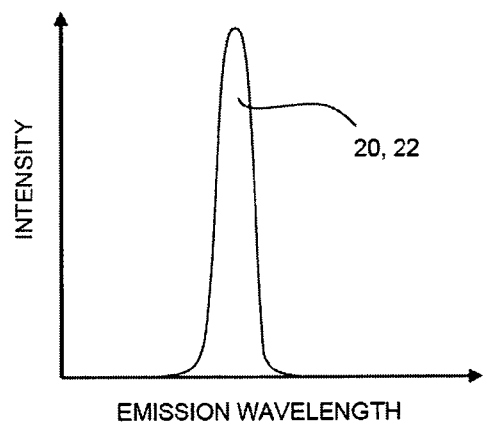
Figure 4B:
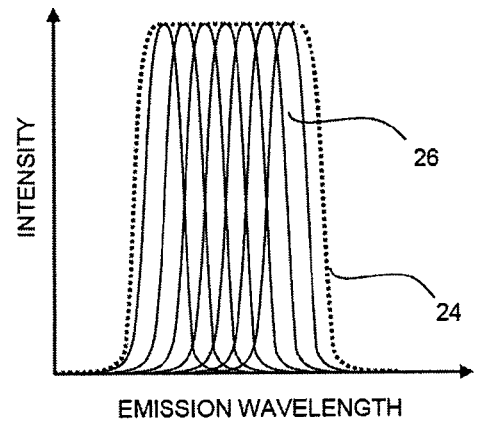

FIGS. 4a and 4b schematically depict the emissions spectrum of the LEDs of the arrays shown in and described with reference to FIGS. 2a to 3b.

Figure 5A:
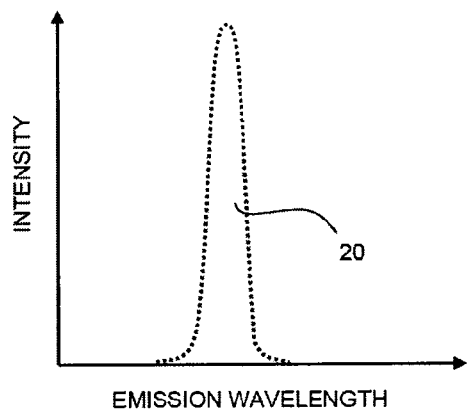
Figure 5B:
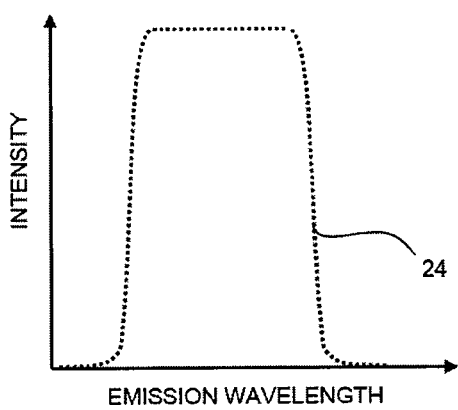

FIGS. 5a and 5b schematically depict the overall emission profile of the arrays shown in and described with reference to FIGS. 2a to 4b.

Figure 6A:
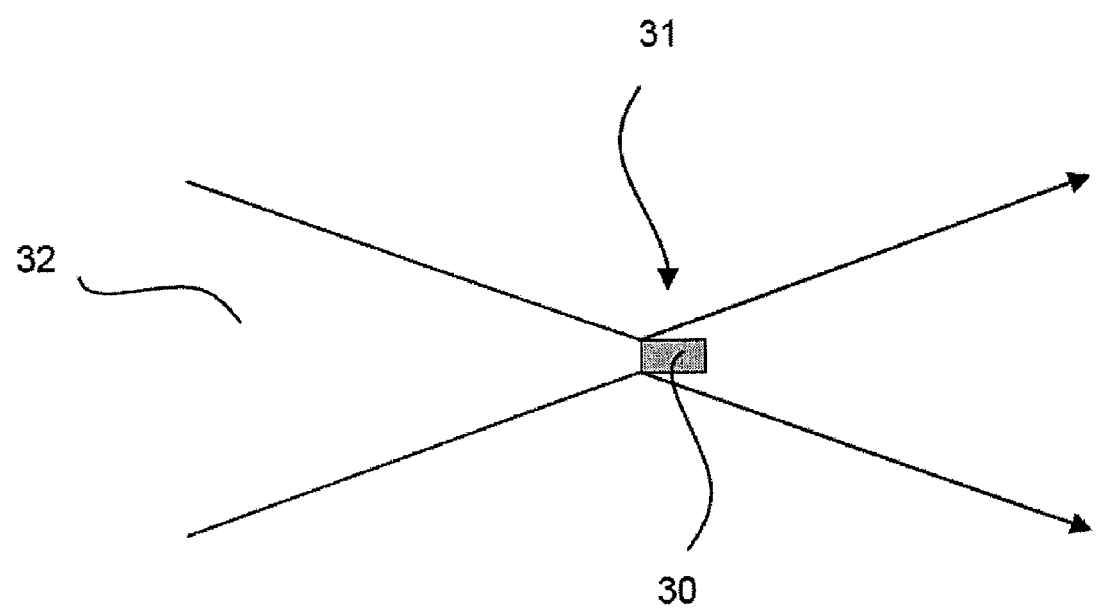

FIG. 6a schematically depicts a radiation peak intensity detection apparatus and its location relative to a radiation beam, in accordance with an embodiment of the present invention.

Figure 6B:
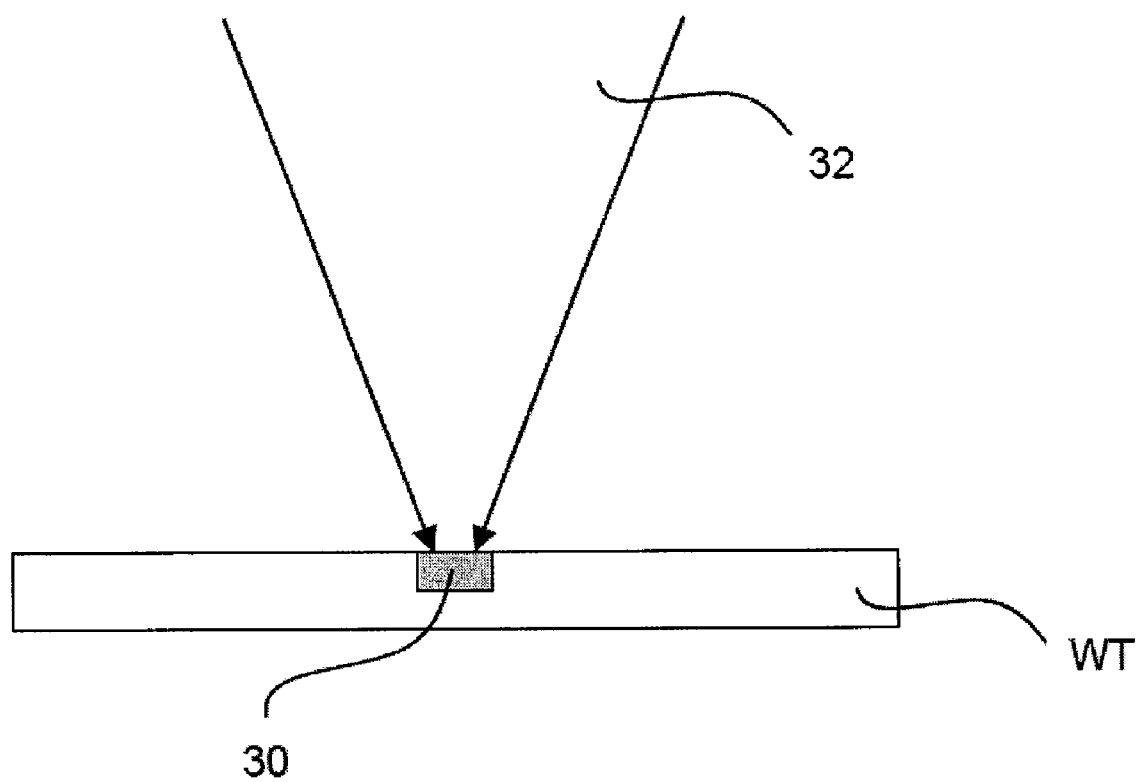

FIG. 6b schematically depicts the location of a radiation peak intensity detection apparatus and its location relative to a radiation beam and a substrate table, in accordance with an embodiment of the present invention.

Figure 7:
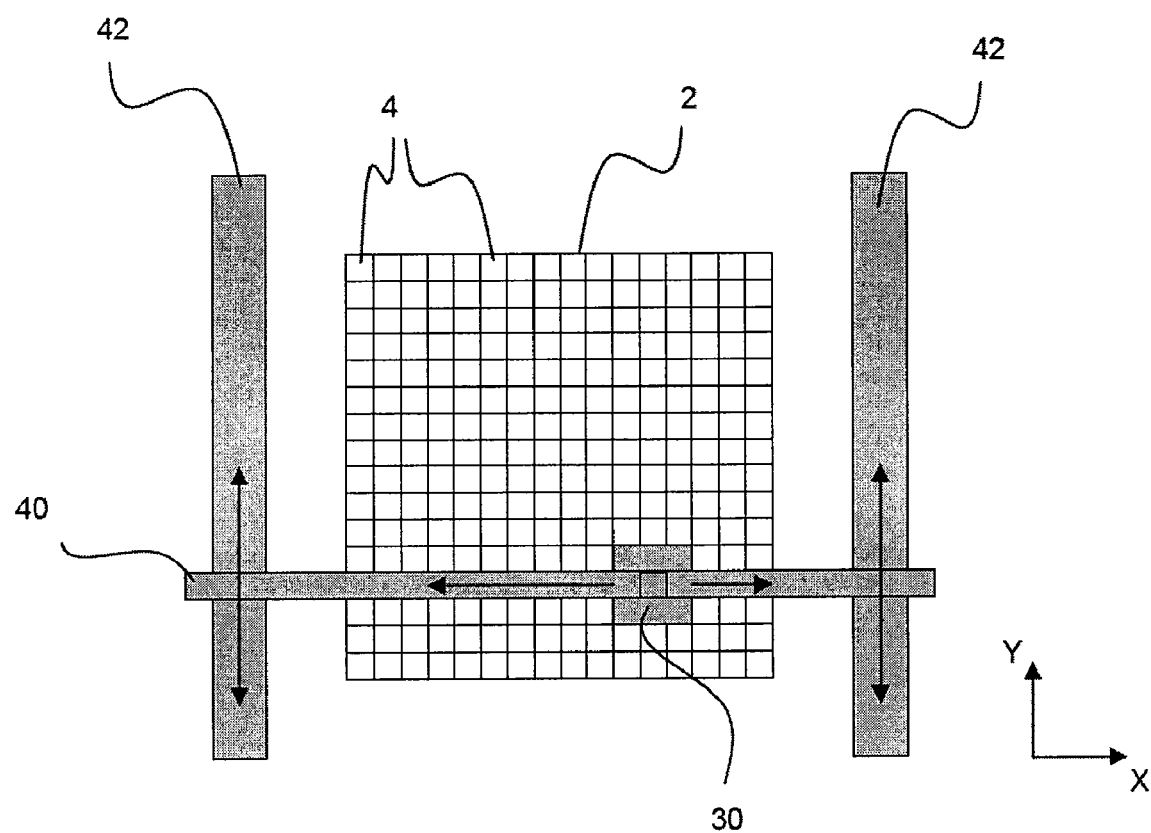

FIG. 7 schematically depicts a radiation peak intensity detection apparatus that is moveable in front of an array of LEDs, in accordance with an embodiment of the present invention.

Figure 8:
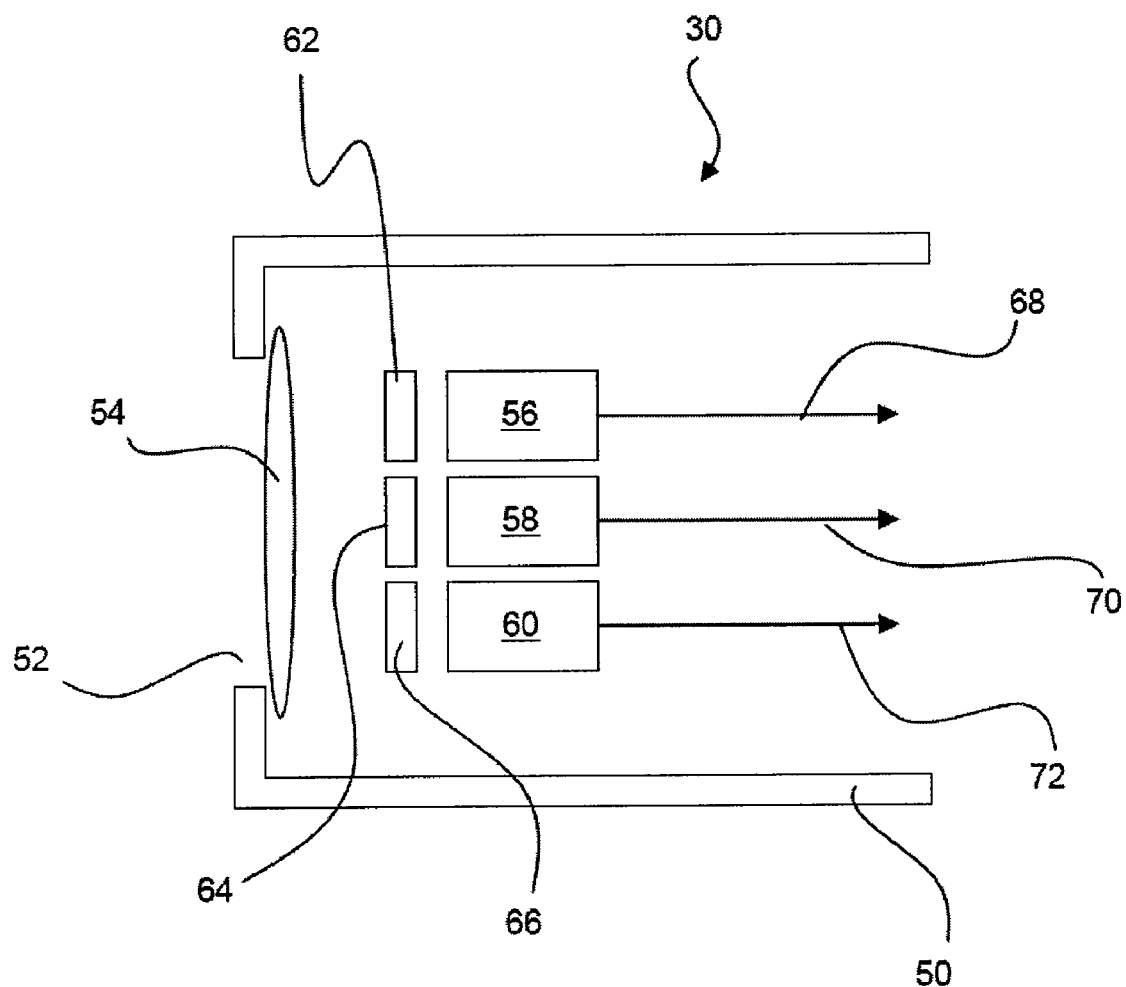

FIG. 8 schematically depicts a radiation peak intensity detection apparatus, in accordance with an embodiment of the present invention.

Figure 9:
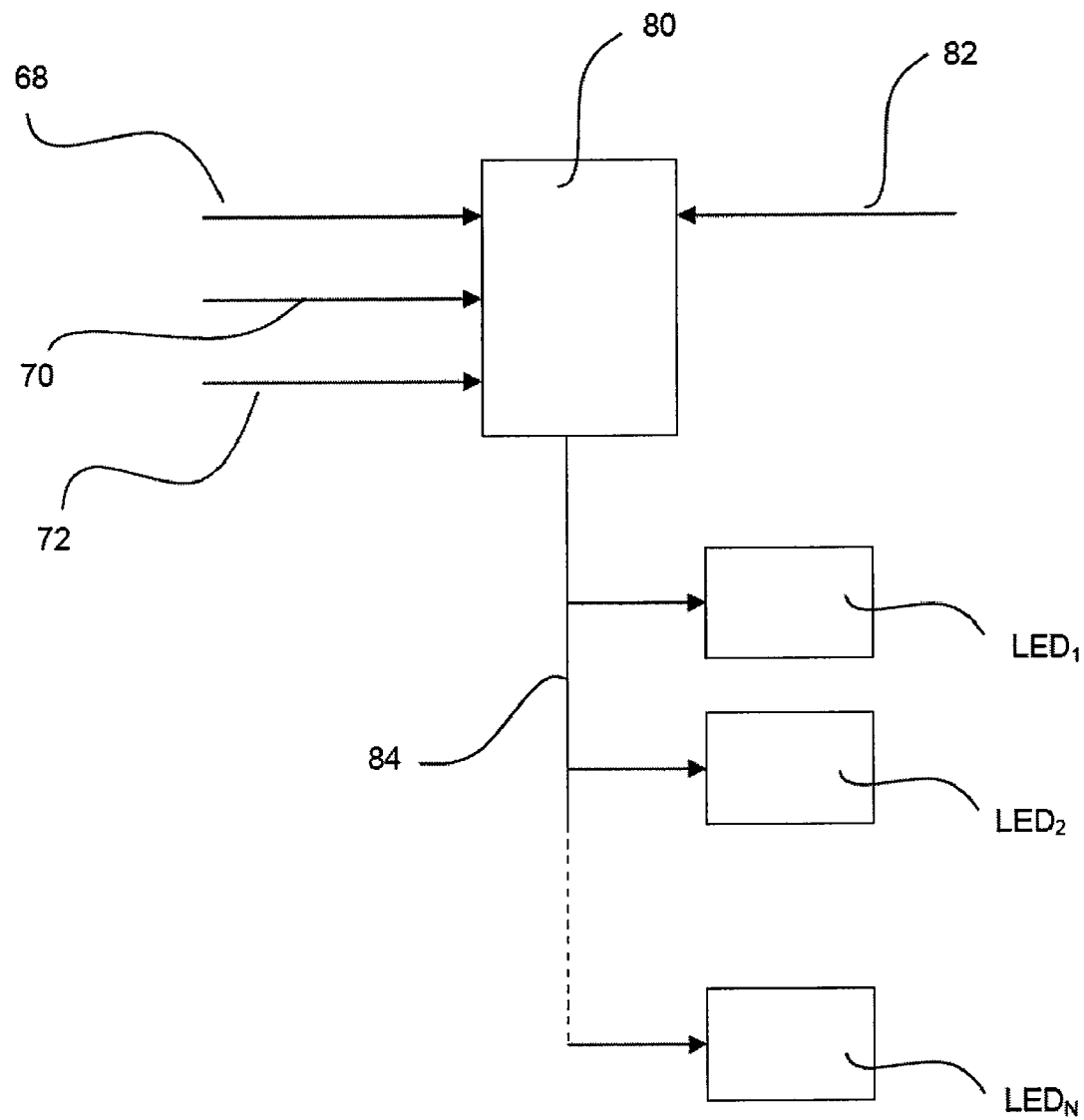

FIG. 9 schematically depicts a control arrangement for controlling an array of LEDs, in accordance with an embodiment of the present invention.

Figure 10:
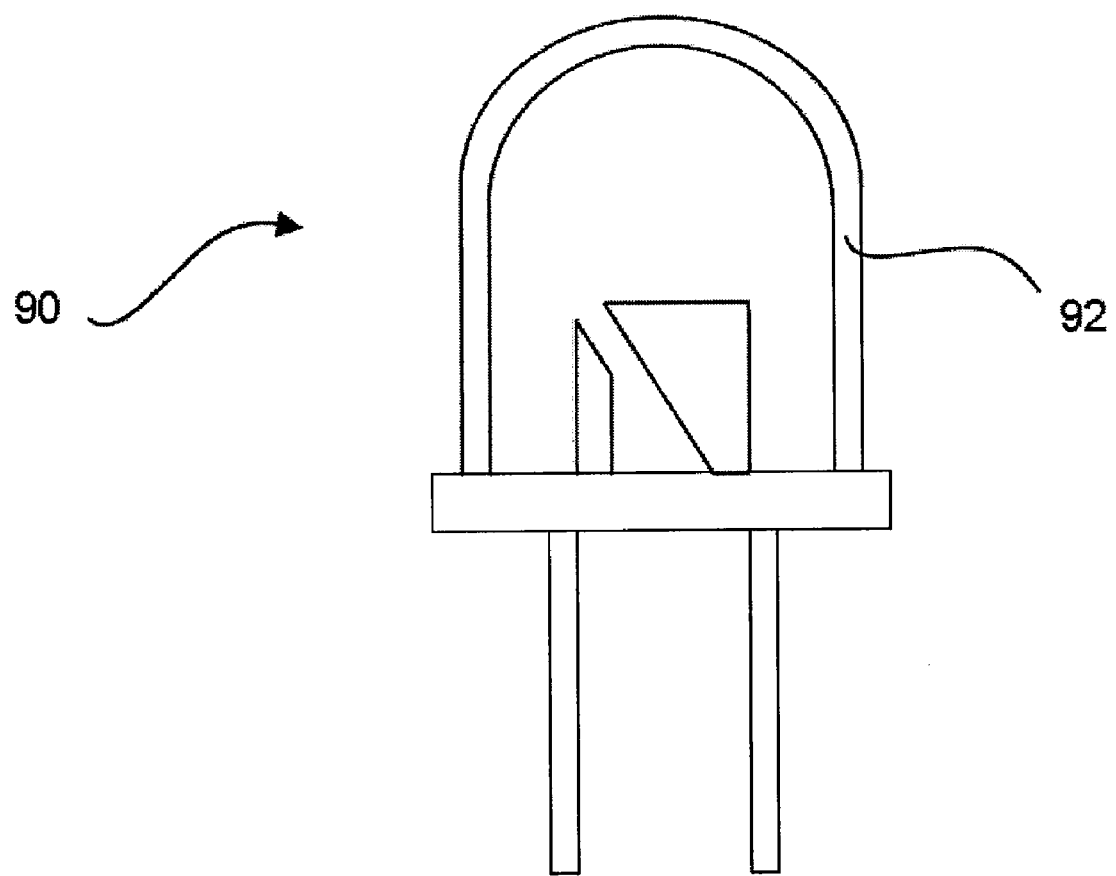

FIG. 10 schematically depicts an LED.

FIGS. 11a and 11b schematically depict LEDs provided with, or located adjacent to a plurality of optical elements, in accordance with an embodiment of the present invention.

Features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number.

DETAILED DESCRIPTION

The invention will be better understood from the following descriptions of various "embodiments" of the invention. Thus, specific "embodiments" are views of the invention, but each does not itself represent the whole invention. In many cases individual elements from one particular embodiment may be substituted for different elements in another embodiment carrying out a similar or corresponding function. The present invention relates to The embodiment(s) described, and references in the specification to "one embodiment," "an embodiment," "an example embodiment," etc., indicate that the embodiment(s) described can include a particular feature, structure, or characteristic, but every embodiment cannot necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Embodiments of the invention can be implemented in hardware, firmware, software, or any combination thereof. Embodiments of the invention can also be implemented as instructions stored on a machine-readable medium, which can be read and executed by one or more processors. A machine-readable medium can include any mechanism for storing or transmitting information in a form readable by a machine (e.g., a computing device). For example, a machine-readable medium can include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions can be described herein as performing certain actions. However, it should be appreciated that such descriptions are merely for convenience and that such actions in fact result from computing devices, processors, controllers, or other devices executing the firmware, software, routines, instructions, etc.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g., having a wavelength of 365, 248, 193, 157 or 126 nm) and extreme ultra-violet (EUV) radiation (e.g., having a wavelength in the range of 5-20 nm).

The term "patterning device" used herein should be broadly interpreted as referring to a device that can be used to impart a radiation beam with a pattern in its cross-section such as to create a pattern in a target portion of the substrate. It should be noted that the pattern imparted to the radiation beam may not exactly correspond to the desired pattern in the target portion of the substrate. Generally, the pattern imparted to the radiation beam will correspond to a particular functional layer in a device being created in the target portion, such as an integrated circuit.

A patterning device may be transmissive or reflective. Examples of patterning device include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions; in this manner, the reflected beam is patterned.

FIGS. 1A and 1B schematically depict lithographic apparatus 100 and lithographic apparatus 100', respectively. Lithographic apparatus 100 and lithographic apparatus 100' each include: an illumination system (illuminator) IL configured to condition a radiation beam B and PB, in FIGS. 1A and 1B, respectively (the radiation beam may be, for example, DUV or EUV radiation); a support structure (e.g., a mask table) MT configured to support a patterning device (e.g., a mask, a reticle, or a dynamic patterning device) MA and connected to a first positioner PM configured to accurately position the patterning device MA; and a substrate table (e.g., a wafer table) WT configured to hold a substrate (e.g., a resist coated wafer) W and connected to a second positioner PW configured to accurately position the substrate W. Lithographic apparatuses 100 and 100' also have projection systems PS and PL, respectively configured to project a pattern imparted to the radiation beam B or PB by patterning device MA onto a target portion (e.g., including one or more dies) C of the substrate W. In lithographic apparatus 100 the patterning device MA and the projection system PS are reflective, and in lithographic apparatus 100' the patterning device MA and the projection system PL are transmissive.

The illumination system IL may include various types of optical components, such as refractive, reflective, magnetic, electromagnetic, electrostatic or other types of optical components, or any combination thereof, for directing, shaping, or controlling the radiation B, PB.

The support structure MT holds the patterning device MA in a manner that depends on the orientation of the patterning device MA, the design of the lithographic apparatuses 100 and 100', and other conditions, such as for example whether or not the patterning device MA is held in a vacuum environment. The support structure MT may use mechanical, vacuum, electrostatic or other clamping techniques to hold the patterning device MA. The support structure MT may be a frame or a table, for example, which may be fixed or movable, as required. The support structure MT may ensure that the patterning device is at a desired position, for example with respect to the projection system PS or PL.

The term "patterning device" MA should be broadly interpreted as referring to any device that may be used to impart a radiation beam B, PB with a pattern in its cross-section, such as to create a pattern in the target portion C of the substrate W. The pattern imparted to the radiation beam B may correspond to a particular functional layer in a device being created in the target portion C, such as an integrated circuit.

The patterning device MA may be transmissive (as in lithographic apparatus 100' of FIG. 1B) or reflective (as in lithographic apparatus 100 of FIG. 1A). Examples of patterning devices MA include reticles, masks, programmable mirror arrays, and programmable LCD panels. Masks are well known in lithography, and include mask types such as binary, alternating phase shift, and attenuated phase shift, as well as various hybrid mask types. An example of a programmable mirror array employs a matrix arrangement of small mirrors, each of which may be individually tilted so as to reflect an incoming radiation beam in different directions. The tilted mirrors impart a pattern in the radiation beam B which is reflected by the mirror matrix.

The term "projection system" may encompass any type of projection system, including refractive, reflective, catadioptric, magnetic, electromagnetic and electrostatic optical systems, or any combination thereof, as appropriate for the exposure radiation being used, or for other factors, such as the use of an immersion liquid or the use of a vacuum. A vacuum environment may be used for EUV or electron beam radiation since other gases may absorb too much radiation or electrons. A vacuum environment may therefore be provided to the whole beam path with the aid of a vacuum wall and vacuum pumps.

Lithographic apparatus 100 and/or lithographic apparatus 100' may be of a type having two (dual stage) or more substrate tables (and/or two or more mask tables) WT. In such "multiple stage" machines the additional substrate tables WT may be used in parallel, or preparatory steps may be carried out on one or more tables while one or more other substrate tables WT are being used for exposure.

Referring to FIGS. 1A and 1B, the illuminator IL receives a radiation beam from a radiation source SO. The source SO and the lithographic apparatuses 100, 100' may be separate entities, for example when the source SO is an excimer laser. In such cases, the source SO is not considered to form part of the lithographic apparatuses 100 or 100', and the radiation beam B passes from the source SO to the illuminator IL with the aid of a beam delivery system BD (FIG. 1B) including, for example, suitable directing mirrors and/or a beam expander. In other cases, the source SO may be an integral part of the lithographic apparatuses 100, 100'—for example when the source SO is a mercury lamp. The source SO and the illuminator IL, together with the beam delivery system BD, if required, may be referred to as a radiation system.

The illuminator IL may include an adjuster AM (FIG. 1B) for adjusting the angular intensity distribution of the radiation beam. Generally, at least the outer and/or inner radial extent (commonly referred to as σ-outer and σ-inner, respectively) of the intensity distribution in a pupil plane of the illuminator may be adjusted. In addition, the illuminator IL may include various other components (FIG. 1B), such as an integrator IN and a condenser CO. The illuminator IL may be used to condition the radiation beam B, to have a desired uniformity and intensity distribution in its cross section.

Referring to FIG. 1A, the radiation beam B is incident on the patterning device (e.g., mask) MA, which is held on the support structure (e.g., mask table) MT, and is patterned by the patterning device MA. In lithographic apparatus 100, the radiation beam B is reflected from the patterning device (e.g., mask) MA. After being reflected from the patterning device (e.g., mask) MA, the radiation beam B passes through the projection system PS, which focuses the radiation beam B onto a target portion C of the substrate W. With the aid of the second positioner PW and position sensor IF2 (e.g., an interferometric device, linear encoder or capacitive sensor), the substrate table WT may be moved accurately, e.g. so as to position different target portions C in the path of the radiation beam B. Similarly, the first positioner PM and another position sensor IF1 may be used to accurately position the patterning device (e.g., mask) MA with respect to the path of the radiation beam B. Patterning device (e.g., mask) MA and substrate W may be aligned using mask alignment marks M1, M2 and substrate alignment marks P1, P2.

Referring to FIG. 1B, the radiation beam B is incident on the patterning device (e.g., mask MA), which is held on the support structure (e.g., mask table MT), and is patterned by the patterning device. Having traversed the mask MA, the radiation beam B passes through the projection system PL, which focuses the beam onto a target portion C of the substrate W. With the aid of the second positioner PW and position sensor IF (e.g., an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1B) can be used to accurately position the mask MA with respect to the path of the radiation beam B, e.g., after mechanical retrieval from a mask library, or during a scan.

In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (known as scribe-lane alignment marks). Similarly, in situations in which more than one die is provided on the mask MA, the mask alignment marks may be located between the dies.

The lithographic apparatuses 100 and 100' may be used in at least one of the following modes:

1. In step mode, the support structure (e.g., mask table) MT and the substrate table WT are kept essentially stationary, while an entire pattern imparted to the radiation beam B is projected onto a target portion C at one time (i.e., a single static exposure). The substrate table WT is then shifted in the X and/or Y direction so that a different target portion C may be exposed.

2. In scan mode, the support structure (e.g., mask table) MT and the substrate table WT are scanned synchronously while a pattern imparted to the radiation beam B is projected onto a target portion C (i.e., a single dynamic exposure). The velocity and direction of the substrate table WT relative to the support structure (e.g., mask table) MT may be determined by the (de-)magnification and image reversal characteristics of the projection system PS.

3. In another mode, the support structure (e.g., mask table) MT is kept substantially stationary holding a programmable patterning device, and the substrate table WT is moved or scanned while a pattern imparted to the radiation beam B is projected onto a target portion C. A pulsed radiation source SO may be employed and the programmable patterning device is updated as required after each movement of the substrate table WT or in between successive radiation pulses during a scan. This mode of operation may be readily applied to maskless lithography that utilizes programmable patterning device, such as a programmable mirror array of a type as referred to herein.

Combinations and/or variations on the described modes of use or entirely different modes of use may also be employed.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion," respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Further, the terms "radiation" and "beam" used herein encompass all types of electromagnetic radiation, including ultraviolet (UV) radiation (e.g., having a wavelength λ of 365, 248, 193, 157 or 126 nm), extreme ultra-violet (EUV or soft X-ray) radiation (e.g., having a wavelength in the range of 5-20 nm, e.g., 13.5 nm), or hard X-ray working at less than 5 nm, as well as particle beams, such as ion beams or electron beams. Generally, radiation having wavelengths between about 780-3000 nm (or larger) is considered IR radiation. UV refers to radiation with wavelengths of approximately 100-400 nm. Within lithography, it is usually also applied to the wavelengths, which can be produced by a mercury discharge lamp: G-line 436 nm; H-line 405 nm; and/or I-line 365 nm. Vacuum UV, or VUV (i.e., UV absorbed by air), refers to radiation having a wavelength of approximately 100-200 nm. Deep UV (DUV) generally refers to radiation having wavelengths ranging from 126 nm to 428 nm, and in an embodiment, an excimer laser can generate DUV radiation used within lithographic apparatus. It should be appreciated that radiation having a wavelength in the range of, for example, 5-20 nm relates to radiation with a certain wavelength band, of which at least part is in the range of 5-20 nm.

FIG. 2a schematically depicts a radiation source SO in side view, for example the radiation source shown in and described with reference to FIG. 1A or 1B. The radiation source SO includes a two-dimensional array (16×16) of individually controllable elements that are capable of emitting radiation 2. Only sixteen elements are shown, because the Figure is a side view of the array. In this embodiment, the elements are LEDs 4. The Figure shows that the array of LEDs 2 includes 16×16 LEDs 4. This number of LEDs 4 is given by way of example only, and in practice the number of LEDs forming the array may be, for instance, a few hundred LEDs, or even a few thousand LEDs.

As discussed above, the radiation source SO may form part of a lithographic apparatus, or the lithographic may be arranged to receive radiation from a radiation source SO external to the lithographic apparatus.

In FIG. 2a, the source SO is shown in a configuration where the LEDs 4 of the array 2 are not emitting radiation. In contrast, in FIG. 2b, the source SO is shown in side view as being in a configuration where the LEDs 4 of the array 2 are emitting radiation (indicated in the Figure by the LEDs 4 being shaded). Referring to FIGS. 2a and 2b in combination, the radiation source SO can be controlled to selectively prevent all radiation emitted by the LEDs 4 of the radiation source SO from passing through the lithographic apparatus by preventing all of the LEDs 2 of the radiation source from emitting radiation. Selectively prevent, in this context, does not mean that the lithographic apparatus is completely inactive. Instead, selectively prevent means that radiation may be selectively prevented from passing through the lithographic apparatus for relatively short periods of time, for example when a substrate is being moved so that a different target potion may be exposed to radiation. It will be appreciated that in this respect the control of the array of LEDs 2 serves as a shutter for the lithographic apparatus. Since the LEDs can be activated or deactivated (or in other words, controlled to emit radiation, or control to stop emitting radiation) at a high speed, control of the LEDs may replace the need to provide the lithographic apparatus with a mechanical shutter or the like. Furthermore, a mechanical shutter may, over time, become worn or damaged due to repeated actuation. The speed of actuation may be reduced if the shutter needs to be capable of withstanding prolonged exposure to EUV radiation, for example. This is because the shutter may need to be formed from a heavy duty material suitable for withstanding prolonged exposure to EUV radiation, for example. By preventing the all of the LEDs from emitting radiation, no mechanical actuation is required to block the radiation. There is no need to block or suppress EUV radiation, for example, for a prolonged period of time. This may reduce contamination due to which might otherwise results from, for example, degradation of a mechanical shutter by EUV radiation.

FIG. 3a schematically depicts in side view an illuminator IL, for example the illuminator shown in and described with reference to FIG. 1A or 1B. The Figure shows that the illuminator IL is provided with an array (16×16) of LEDs 2. Only sixteen LEDs are shown, because the Figure is a side view of the array. The array of LEDs 2 is shown as including 16×16 LEDs 4. However, any number of LEDs 4 may form the array 2, and in practice the array 2 may include, for instance, a few hundred or even a few thousand LEDs.

By providing the illuminator IL with an array of LEDs 2, there is no need to provide the lithographic apparatus with another source of radiation. The array of LEDs 2 in the illuminator IL may serve as the single and only source of radiation in the lithographic apparatus. The array of LEDs 2 in the illuminator IL may also function as a shutter, as described above in relation to FIGS. 2a and 2b.

One or more LEDs 4 of the array 2 may be selectively controlled to emit radiation or not emit radiation. Such selective control may be used to regulate, for example, the total energy or intensity profile of the radiation generated by the array 2 as a whole. The angular intensity distribution of radiation emitted by the array 2 can be controlled by selectively re-directing the radiation using, for example, an array of individually controllable elements such as mirrors or diffracting elements, or by using one or more diffractive optical elements or the like. Alternatively, the control of the angular intensity distribution of the radiation emitted by the array 2 can be achieved by selecting specific patterns or configurations of LEDs 4 of the array 2 to emit radiation. This can be achieved by locating the array 2 in or adjacent to a pupil plane 6 of the illuminator. Additional optical components (not shown) may be provided between the array of LEDs 2 and the pupil plane 6 in order to couple radiation emitted by the array 2 into that pupil plane 6. A micro lens array is an example of such an optical component. Further optical components 8 may be used to, for example, homogenize the radiation emitted by the array 2. A quartz rod is an example of such an optical component.

FIG. 3b schematically depicts an example of how the array 2 can be controlled to create a specific angular intensity distribution, sometimes referred to as an illumination mode. FIG. 3b the array 2 in an end-on view, so that all sixteen LEDs 4 of the array 2 are visible. FIG. 3b shows that only a sub-set 10 of the LEDs 4 of the array 2 are controlled to emit radiation. This subset of LEDs 10 is configured to form four regions of emission that are located in each corner of the array 2. The regions of emission form what is known in the art as a "quadrapole" illumination mode. Other illumination modes can be controlled by selecting one or more different sub-sets of LEDs 4 to emit radiation. For example, an annular illumination mode could be created by controlling a sub-set of LEDs 4 that are in an annular configuration to emit radiation.

The remainder of this description will refer to the array of LEDs, and the LEDs that are part of that array, in general. The description is thus equally applicable to the array of LEDs when it is located in the illuminator of a lithographic apparatus, when the array forms the source in a lithographic apparatus, or when the array forms the source for a lithographic apparatus.

FIG. 4a depicts a desirable emission profile 20 for the array of LEDs described above. The emission profile of the array is desirable in that all of the LEDs of the array have the same emission profile (thus, only a single emission profile is shown in the Figure). The emission bandwidth of the array is thus narrow. Such a desirable emission profile 20 is only achievable if the individual emission profiles of each LED 22 are substantially uniform and consistent across the array. In practice, this is difficult to achieve or maintain.

As discussed above, the wavelength (or frequency) at which a peak in the emission intensity of radiation emitted by an LED depends on the temperature of the LED, the current applied to the LED, any degradation of the LED, and also possible manufacturing differences between different LEDs. Therefore, even if it is possible to ensure that at a specific time the emission profile of the LEDs in the array is uniform and consistent across the array, there is no guarantee that such uniformity and consistency will be maintained over any given period of time. This is undesirable.

FIG. 4b illustrates the overall emission profile of the array of LEDs after a period of time 24. It can be seen that there is a stark contrast between the emission profile across the array of LEDs after a period of time 24, and the desired emission profile across LEDs shown in and described with reference to FIG. 4a. Referring back to FIG. 4b, the emission profile of each LED within the array 26 no longer peaks at the same wavelength. The emission bandwidth of the array is thus broader than that shown in FIG. 4a. Such inconsistency between the peak emission wavelengths may arise due to the reasons given above (e.g., temperature changes, current changes, etc.).

FIGS. 5a and 5b summarize the situations described in relation to FIGS. 4a and 4b. FIG. 5a shows the desired emission profile across the array of LEDs 20. FIG. 5b shows how, over time, the desired emission profile may degrade or change into a non-uniform emission profile across the array 24. In other words, the LEDs of the array will not all be emitting radiation at the same desired peak wavelength. It is desirable to ensure that radiation emitted by the array as a whole and has a profile which is substantially the same as that shown in FIG. 5a, as opposed to the profile shown in FIG. 5b. Presently, however, and for an LED array used in or in connection with a lithographic apparatus, no method or apparatus has been proposed for identifying a change in the wavelength at which peak intensity emission of the LEDs of the array occurs, and using this identification to control the LEDs and modify the output of the LED array as a whole such that it has a more uniform emission profile.

According to an embodiment of the present invention, there is provided a lithographic apparatus which has a radiation peak intensity detection apparatus for detecting a peak in the intensity of an emission spectrum of an LED of the array of LEDs. A control module (for example, provided in the radiation peak intensity detection apparatus or in a controller of the LEDs) is able to process information related to the detected peak (e.g., the frequency or wavelength at which the peak occurs), and to control the LED or LEDs in order to ensure that the emission profile of the array of LEDs as a whole is more uniform. A feedback loop is this created. Additionally or alternatively, such detection of the peak may be undertaken when the lithographic apparatus is in operation, or during a downtime of the lithographic apparatus. The detection may alternatively or additionally be used as a calibration routine. A more uniform emission profile of the array of LEDs is advantageous, since it allows the array of LEDs to be tuned to a desired peak, for example a peak intensity at a certain wavelength or frequency. The desired peak may have a wavelength which the lithographic apparatus and/or the resist on the substrate is designed for. Tuning (or in other words adjustment) of the peaks of the LEDs and the array of LEDs as a whole may allow for improved imaging of patterns on a resist coated substrate, or the maintenance of a certain quality or level of imaging.

The radiation peak intensity detection apparatus may be fixed in position relative to the lithographic apparatus. The radiation peak intensity detection apparatus may be placed in a location for which radiation emitted by any one of the LEDs of the array is incident upon the radiation peak intensity detection apparatus. This is so that any one of the LEDs of the array can be controlled to emit radiation, and the radiation peak intensity detection apparatus can then detect properties of the radiation emitted by that one LED. The radiation peak intensity detection apparatus may not be fixed in position, and can instead be moveable into the position at which radiation emitted by any one of the LEDs of the array can be detected. Alternatively, the radiation peak intensity detection apparatus may be moveable into one or more positions where the emission of one or more specific LEDs may be detected. For instance, the radiation peak intensity detection apparatus may be moveable in front of the array of LEDs and positioned in front of one (or in other examples, one or more) of the LEDs of the array in order to determine properties of that LED's emission profile. Specific examples of the use, location and design of the radiation peak intensity detection apparatus will now be described with reference to FIGS. 6a, 6b, 7 and 8.

FIG. 6a schematically depicts a radiation peak intensity detection apparatus 30. The radiation peak intensity detection apparatus 30 is shown as being located at an intermediate focus 31 of a radiation beam 32 of a lithographic apparatus (for example the lithographic apparatus shown in and described with reference to FIG. 1). This could for instance be in the reticle plane of the lithographic apparatus. In one example, the radiation beam 32 may contain radiation emitted by one or more of the LEDs or the array described above. Since the radiation peak intensity detection apparatus 30 is located at the intermediate focus 31, the radiation peak intensity detection apparatus 30 can detect radiation emitted by any one or more of the LEDs of the array. This means that by selectively controlling only a single LED of the array to emit radiation, properties of the emission profile of that LED (and that LED alone) can be determined. In one example, the radiation peak intensity detection apparatus 30 is moveable into and out of the intermediate focus. This is so that when the radiation peak intensity detection apparatus 30 is not being used, it does not affect the propagation of the radiation beam 32 through the lithographic apparatus.

The radiation peak intensity detection apparatus may be located in an area of the lithographic apparatus where radiation from all of the LEDs of the arrays incident, but which does not affect the propagation of the radiation beam through the lithographic apparatus. For instance, the radiation peak intensity detection apparatus may be located in a position where radiation emitted by the array of LEDs is incident, but not used to pattern a substrate. For example, the radiation peak intensity detection apparatus may be located in an area of the lithographic apparatus where radiation is scattered or reflected, or on or in a patterning device, a patterning device holder, or a substrate holder.

FIG. 6b schematically depicts another example of a possible location of the radiation peak intensity detection apparatus. In this example, the radiation peak intensity detection apparatus 30 is located in a substrate table WT, for example the substrate table shown in and described with reference to FIG. 1A or 1B. The radiation peak intensity detection apparatus 30 will function in the same manner as described in relation to FIG. 6a. The substrate table WT may be moved such that a radiation beam 32 is incident upon the radiation peak intensity detection apparatus 30, for example when patterns are not being applied to a substrate located on the patterning device.

Although FIG. 6b describes the location of the radiation peak intensity detection apparatus 30 relative to a substrate table WT, the radiation peak intensity detection apparatus 30 could equally be located in or on a patterning device, or a holder for a patterning device. The patterning device and/or the patterning device holder may be moved to bring the radiation peak intensity detection apparatus 30 into a position where the radiation beam 32 is incident upon it.

In FIGS. 6a and 6b, the radiation peak intensity detection apparatus has been shown as being fixed in a position which allows properties of the emission spectrum of any one of the LEDs of the array to be determined, or being moveable into and out of such a position. In another example, the radiation peak intensity detection apparatus may be moved into one or more positions whereby the properties of the emission spectrum of one or more specific LEDs of the array may be determined. FIG. 7 shows such an example.

FIG. 7 schematically depicts the radiation peak intensity detection apparatus 30, according to one embodiment of the present invention. The radiation peak intensity detection apparatus 30 is moveable in an X direction along a first support 40. The radiation peak intensity detection apparatus 30 may be moveable along the first support 40 using motors, linear actuators, or any other suitable configuration. The first support 40 is in connection with two second supports 42 which extend substantially in the Y direction. The first support 40 is moveable along these second supports 42, such that the first support 40 is moveable in the Y direction. The first support 40 may be moveable along the second supports 42 using one or more motors, linear actuators or any other suitable configuration. Since the radiation peak intensity detection apparatus 30 is moveable along the first support 40 in the X direction, and since the first support 40 is moveable in the Y direction along the second supports 42, it will be understood that the radiation peak intensity detection apparatus 30 may be moved in the X and/or Y direction.

FIG. 7 also schematically depicts the array of the LEDs 2 described above, according to an embodiment of the present invention. A detecting surface or element of the radiation peak intensity detection apparatus 30 is arranged to face the array of LEDs 2, such that a property of the radiation emitted by the LEDs 4 of the array 2 may be determined by the radiation peak intensity detection apparatus 30. The radiation peak intensity detection apparatus 30 is moveable around the array by moving the radiation peak intensity detection apparatus 30 in the X and/or Y direction. The radiation peak intensity detection apparatus 30 is moveable to any specific location relative to the array 2, such that a property of the emission profile of one or more specific LEDs 4 of the array 2 can be determined. For instance, the radiation peak intensity detection apparatus may be configured and/or positioned such that it can only receive radiation emitted by a single LED 4. Alternatively, the radiation peak intensity detection apparatus 30 can be configured such that it can receive radiation from more than one LED 4. In general, the radiation peak intensity detection apparatus 30 is moveable between positions which are adjacent to the LEDs 4 of the array 2, such that the radiation peak intensity detection apparatus 30 can be moved to a position where the emission spectrum of a specific LED (or one of a group of LEDs) can be detected.

By controlling the LEDs 4 of the array 2 to emit radiation, the radiation peak intensity detection apparatus 30 can be moved around the array to determine a property of the emission profile of one or more specific LEDs of the array. The detection of a property may be made easier if only one or a selection of LEDs are controlled to emit radiation at any one time.

In one example, the radiation peak detection may include one or more optical fibers that are moveable into and out of the path of radiation emitted by one or more LEDs of the array. The one or more optical fibers may be coupled to a photo detector or the like that is fixed in position, and which is not located in a path of radiation emitted by one or more LEDs of the array.

The radiation peak intensity detection apparatus referred to above can be any apparatus capable of detecting the peak in the intensity of an emission spectrum of radiation emitted by the LEDs, and/or changes in this peak, and the wavelength (or a range of wavelengths) or the frequency (or a range of frequencies) at which this peak occurs. The radiation peak intensity detection apparatus could therefore be, for example, a spectrometer. A spectrometer is capable of determining the peak intensity of an emission spectrum of radiation.

FIG. 8 schematically depicts a radiation peak intensity detection apparatus 30, in accordance with an embodiment of the present invention. The radiation peak intensity detection apparatus 30 includes a housing 50. The housing 50 is provided with an opening 52, through which radiation may enter the radiation peak intensity detection apparatus 30. The opening 52 may be, or may be provided with, a lens 4. The lens may be used for collecting, gathering, focusing, etc radiation. Alternatively or additionally, the opening 52 may be provided with a membrane or other covering for preventing any particles or contamination entering the housing 50.

Located within the housing 50 are three radiation intensity detectors: a first radiation intensity detector 56, a second radiation intensity detector 58, and a third radiation intensity detector 60. The radiation detectors 56, 58 and 60 may be, for example, photo diodes which are sensitive to radiation emitted by the LEDs, or the like. Located in front of each of the radiation intensity detectors 56, 58 and 60 is a filter, e.g., a narrow band filter (e.g., an about 2-3 nm band-pass filter). Located in front of the first radiation intensity detector 56 is a first narrow-band filter 62. Located in front of the second radiation intensity detector 58 is a second narrow-band filter 64. Located in front of the third radiation intensity detector 60 is a third narrow-band filter 66. Each of the narrow-band filters 62, 64, 66 has a different central pass-wavelength (or frequency). The central pass-wavelength of each of the narrow-band filters 62, 64, 66 are separated (or in other words shifted) by about 2-3 nm. Since the narrow-band filters 62, 64, 66 each have a different band-pass of about 2-3 nm, the three narrow-band filters 62, 64, 66 together cover a range of about 6-9 nm. In one example, at least one of the narrow-band filters has a central pass-wavelength which is equal to the desired peak intensity output of the LEDs (e.g., about 365 nm). Thus, a possible configuration for the narrow-band filters 62, 64, 66 is that the first narrow-band filter 62 has a central pass-wavelength of about 362 nm, the second narrow-band filter 64 has a central pass-wavelength of about 365 nm, and the third narrow-band filter 66 has a central pass-wavelength of about 368 nm.

Since each of the narrow-band filters 62, 64, 66 has a band-pass wavelength which is different from all of the other filters, 62, 64, 66 and because one of the narrow-band filters contains the central-pass wavelength which is desired, it is possible to detect changes in the peak intensity of the emission spectrum of an LED. Because an odd number of filters 62, 64, 66 are used, it is possible to easily track changes in the wavelength at which peak emission occurs, and to control the diodes to ensure that the peak is centered on the desired peak by ensuring that the maximum intensity is measured by the detector which is located by the filter which is sensitive to the desired frequency of wavelength.

Although the use of three radiation intensity detectors has been described, each detector being associated (e.g., provided with) a filter having a different pass-wavelength, other arrangements are possible. For example, one or more radiation intensity detectors may be provided, each radiation detector being associated with a filter that is located in a position whereby radiation emitted by an LED of the array passes through the filter before being detected by the radiation intensity detector. As described above, an odd number of radiation intensity detectors, each detector being associated (e.g., provided with) a filter having a different pass-wavelength, may be advantageous.

The radiation peak intensity detection apparatus 30 described in the Figure is simpler, smaller and cheaper to construct and maintain than a spectrometer. A peak in an emission profile may also be determined more rapidly using the described radiation peak intensity detection apparatus 30 than with a spectrometer.

Each of the radiation intensity detectors 56, 58, 60 is provided with an output 68, 70, 72. Each of the outputs 68, 70, 72 may be in connection with (or in other words provided to) a control module. The control module may be configured to control the LEDs of the array in order to, for example, take into account changes in the peak intensity of the emission spectra of the LEDs. The control module may form a part of the radiation source, form a part of the radiation peak intensity detection apparatus, or may be an independent piece of apparatus. An example of a control module and its functionality is described in relation to FIG. 9.

FIG. 9 schematically depicts an exemplary control module 80. The control module 80 is shown as being arranged to receive the outputs 68, 70, 72 from the radiation intensity detectors shown in and described with reference to FIG. 8. Referring back to FIG. 9, the control module 80 is also configured to receive a further input 82. The further input 82 may provide the control module 80 with information regarding, for example, the ambient temperature, the temperature of the array of LEDs, the temperature of one or more LEDs within the array, and the required or desired frequency or wavelength for the peak emission of the LEDs of the array. The control module 80 is in connection with 84 drivers for each LED, for example $LED_1, LED_2, \ldots LED_N$ (where N is the total number of LEDs in the array). Alternatively, the control module 80 may be in direct connection with each LED.

Using the information provided by the radiation intensity detectors and the information provided by the further input 82, the control module is able to control the LEDs via the LED driver circuitry $LED_1$-$LED_N$ to control the LEDs to ensure that the emission spectra of the LEDs have a peak intensity at a wavelength or frequency or which coincides with a desired wavelength or frequency.

In use, a single LED may be controlled to emit radiation. The radiation peak intensity detection apparatus will detect at least a part of the emission profile of the radiation emitted by this LED and provide this information to the control module. The control module will vary (e.g., undertake a sweep of) a first property (e.g., current and/or voltage) that is used to control the LED. In this embodiment, the current is varied. The control module will then determine the current for which the maximum intensity is measured by the peak radiation intensity detector that is provided with the narrow-band pass filter which corresponds to the desired output of the LED (for example 365 nm). When a peak in intensity has been detected at this detector, the magnitude of the current used to achieve this peak is stored for future reference and control of the LED, or is used within a short period of time to control the LED. This current is therefore a specific current, or a specific 'first property', as described above.

This process is undertaken for all of the elements of the array in order to determine what current is necessary to drive each of the LEDs of the array which results in a peak intensity at a desired wavelength or frequency. The temperature of each LED can also be taken into account such that the peak intensity of the LED emission spectra is measured as a function of not only current, but also temperature. When all of the required information has been gathered, the information can be used to provide all of the LEDs with the current that is required to ensure that all of the LEDs of the array have an emission spectra with a peak intensity at the desired wavelength or frequency.

In one example, as well as ensuring that the peak intensity of the emission spectra of each LED has a desired wavelength or frequency, the apparatus and methods referred to above may also be used to measure the intensity at that peak. This can be used to ensure that the intensity is substantially constant for all LEDs across the array, thus ensuring that the LED array as a whole has a uniform emission profile and/or a desired (e.g., narrow) bandwidth. The emission intensity may also be a function of the current used to control the LED, or another property used to control the LED, such as the voltage.

In one example, the control module can determine the specific current (or more generally, a specific property) that is required to ensure that the LED has a desired peak in its emission spectrum. Alternatively or additionally, the control module can be provided with information related to such a specific current (or more generally, a specific property), for example the magnitude.

FIG. 10 schematically depicts an LED 90, according to one embodiment of the present invention. The LED is provided with a casing 92 that is substantially transparent to radiation which the LED 90 is designed to emit (e.g., radiation having a peak emission at a wavelength of 365 nm). It is known that LEDs are Lambertian radiators, in that the profile of the emission follows the Cosine Emission Law (sometimes referred to as Lambert's Emission Law). It is sometimes desirable to ensure that the emission profile of an LED is not Lambertian in nature.

According to an embodiment of the present invention, an LED is provided with a plurality of, for example, lenses for transforming (or in other words changing) the Lambertian emission profile into a more desirable emission profile (for example a more cone-like, or in other words conical emission profile). The LED itself may be provided with integral a plurality of lenses, or the plurality of lenses may be provided adjacent to the LED.

FIG. 11a shows an LED 100, according to an embodiment of the present invention. The LED is provided with a casing 102 that is substantially transparent to radiation that the LED is designed to emit (e.g., radiation having a peak emission at a wavelength of about 365 nm). The casing 102 is provided with a plurality of lenses 104, 106, 108, 110 which are designed to change the inherent Lambertian profile of the LED 100 and make the emission profile of the LED 100 more desirable.

FIG. 11b shows an LED 120, according to an embodiment of the present invention. The LED 120 is provided with a casing 122 that is substantially transparent to radiation that the LED 120 is designed to emit (e.g., radiation having a peak emission at a wavelength of about 365 nm). Located adjacent to the LED 120 are a plurality of lenses 124, 126, 128, 130. The lenses 124, 126, 128, 130 are designed to change the inherent Lambertian profile of the LED 120 and make the emission profile of the LED 120 more desirable Although the use of lenses has been described for changing the Lambertian emission profile of an LED, any suitable optical element may be used. For example, the LED may be provided with, or be located adjacent to, one or more reflective, refractive, diffractive, etc., optical elements that are arranged to correct the Lambertian emission profile of the LED.

All of the above embodiments have been described in relation to the use of LEDs in an array. However, the invention is not limited to the use of LEDs. With regard to the embodiments shown in and described with reference to FIGS. 2 to 9, the array of LEDs may be replaced by an array of any other individually controllable elements that are capable of emitting radiation. For instance, the elements may be laser diodes. With regard to the embodiments shown in and described with reference to FIGS. 10, 11a and 11b, the use of one or more optical elements to correct and/or change the emission profile of an LED may additionally or alternatively be used in conjunction with other elements which are capable for emitting radiation, for example a laser diode. Although the embodiments shown in and described with reference to FIGS. 10, 11a and 11b have been described in relation to a single LED, the embodiments are also applicable to arrays of LEDs or other elements capable to emitting radiation. For example, the plurality of lenses may be provided in each of the elements of the array, or can be provided in a sheet or the like located adjacent to the array of elements. In any of the described embodiments, an element that is capable of emitting radiation may be configured to emit radiation that has a peak intensity in its emission spectrum at a wavelength in the UV, EUV, or beyond EUV range of the electromagnetic spectrum. This may be advantageous, since UV, EUV, or beyond EUV radiation is commonly used in lithography.

In the above embodiments, the use of a control module has been described. The control module can be anything capable of providing some sort of control. For example, the control module could be a computer system, and embedded processor provided with an appropriate program, an oscilloscope, or the like.

CONCLUSION

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

The present invention has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

What is claimed is:

1. A lithographic apparatus comprising:
an illumination system for providing a beam of radiation from radiation received from a radiation source, the radiation source comprising individually controllable elements, each individually controllable element being capable of emitting radiation;
a support structure for supporting a patterning device, the patterning device serving to impart the radiation beam with a pattern in its cross-section;
a substrate table for holding a substrate;
a projection system for projecting the patterned radiation beam onto a target portion of the substrate; and
a radiation peak intensity detection apparatus configured to detect a peak in the intensity of an emission spectrum of one or more individually controllable elements of the radiation source,
wherein respective elements of the individually controllable elements are each associated with at least two corresponding optical elements, the corresponding optical elements being provided on a substantially transparent casing integrated with and surrounding the associated individually controllable element.

2. The apparatus of claim 1, wherein the radiation source is located in a pupil plane of the illuminator, or adjacent to a pupil plane of the illuminator.

3. The apparatus of claim 1, wherein the individually controllable elements of the radiation source are configured to emit radiation that has a peak emission wavelength in the UV, EUV, or beyond EUV range of the electromagnetic spectrum.

4. The apparatus of claim 1, wherein the peak in the emission spectrum is associated with an emission wavelength or frequency at which the intensity of the emission spectrum is the highest.

5. The apparatus of claim 1, wherein the radiation peak intensity detection apparatus is located in a position where radiation emitted by any one element is incident upon the radiation peak intensity detection apparatus.

6. The apparatus of claim 5, wherein the radiation peak intensity detection apparatus is moveable into and out of the position.

7. The apparatus of claim 1, wherein the radiation peak intensity detection apparatus is moveable between positions which are adjacent to the elements of the individually controllable elements.

8. The apparatus of claim 7, wherein the radiation peak intensity detection apparatus is moveable between positions which are adjacent to the elements, such that the radiation peak intensity detection apparatus can be moved to a position where the emission spectrum of a specific individually controllable element can be detected.

9. The apparatus of claim 1, wherein the radiation peak intensity detection apparatus comprises:
one or more radiation intensity detectors; and
wherein each radiation detector is associated with a filter that is located in a position whereby radiation emitted by an individually controllable element of the radiation source passes through the filter before being detected by the radiation intensity detector.

10. The apparatus of claim 9, wherein the radiation peak intensity detection apparatus comprises:
an odd number of radiation intensity detectors; and
wherein each radiation detector is associated with a filter that is located in a position whereby radiation emitted by an individually controllable element of the radiation source passes through the filter before being detected by the radiation intensity detector.

11. The apparatus of claim 9, wherein each filter has a different central pass-frequency or pass-wavelength.

12. The apparatus of claim 9, wherein one filter has a central pass-frequency or pass-wavelength which corresponds to a desired frequency or wavelength.

13. The apparatus of claim 1, further comprising a control module configured to control the individually controllable elements of the radiation source.

14. The apparatus of claim 13, wherein the control module:
forms a part of the radiation source; or
forms a part of the radiation peak intensity detection apparatus; or
is an independent part of the lithographic apparatus.

15. The apparatus of claim 13, wherein the control module is arranged to control a property that is used to control each of the individually controllable elements.

16. The apparatus of claim 15, wherein the control module is arranged to vary a property that is used to control the individually controllable elements.

17. The apparatus of claim 15, wherein the control module is arranged to control a property that is used to control the individually controllable elements, the property being a specific property which ensures that an individually controllable element being controlled has a desired peak in its emission spectrum.

18. The apparatus of claim 17, wherein the control module is arranged to determine the specific property, or is provided with information related to the specific property.

19. The apparatus of claim 15, wherein the property is a current provided to each individually controllable element.

20. The apparatus of claim 1, wherein the optical elements are configured to change an emission profile of the associated individually controllable element.

21. The apparatus of claim 20, wherein the plurality of optical elements are diffractive, reflective or refractive.

22. The apparatus of claim 1, wherein the individually controllable elements are LEDs or laser diodes.

23. A lithographic apparatus according to claim 1 wherein individual radiation elements are organized into an array of individually controllable elements.

24. The apparatus of claim 23, wherein the radiation peak intensity detection apparatus is configured to move between positions which are adjacent to the array of individually controllable elements.

25. The apparatus of claim 24, wherein the radiation peak intensity detection apparatus is configured to move between positions which are adjacent to the array of individually controllable elements, such that the radiation peak intensity detection apparatus is moved to a position where the emission spectrum of a specific individually controllable element is detected.

26. The apparatus of claim 23, further comprising a control module configured to control the array of individually controllable elements of the radiation source.

27. The apparatus of claim 23, wherein the optical elements are configured to change an emission profile of the associated individually controllable element in the array.

28. A method of detecting properties of a radiation source that is used in connection with a lithographic apparatus, or provided in the lithographic apparatus, the radiation source comprising an array of individually controllable elements, each individually controllable element being capable of emitting radiation, the method comprising:

varying a property that is used to control an individually controllable element;

changing an emission profile of the individually controllable element via at least two corresponding optical elements, the corresponding optical elements being provided on a substantially transparent casing integrated with and surrounding the associated individually controllable element;

detecting the intensity of radiation emitted by the individually controllable element as the property is varied in order to identify changes in the intensity of an emission spectrum of the individually controllable element as the property is varied; and determining a specific property for which the peak in the intensity of an emission spectrum of the element is a desired peak.

29. The method of claim 28, further comprising controlling the individually controllable element using the specific property.

30. The method of claim 29, wherein the individually controllable element is controlled using the specific property during the exposure of a target portion of a substrate.

31. The method of claim 28, comprising repeating the method for a plurality of individually controllable elements of the array, or for all individually controllable elements of the array.

32. The method of claim 28, wherein, before detecting radiation emitted by the individually controllable element as the property is varied, the method comprises moving a detector into a position where radiation emitted by the individually controllable element can be detected so that the detection may be undertaken.

33. The method of claim 28, wherein the desired peak is when the intensity of the emission spectrum is highest at a desired wavelength or frequency.

* * * * *